United States Patent

Olson et al.

[11] Patent Number: 5,334,696
[45] Date of Patent: Aug. 2, 1994

[54] POLYIMIDE RESIN LAMINATES

[75] Inventors: Larry D. Olson, Viroqua; Jeffrey R. Kamla; Henry R. Johnson, both of West Salem, all of Wis.

[73] Assignee: Allied Signal Inc., Morris Township, Morris County, N.J.

[21] Appl. No.: 993,147

[22] Filed: Dec. 18, 1992

[51] Int. Cl.$^5$ .................. C08G 73/10; C08L 79/08
[52] U.S. Cl. .................... 528/322; 528/170; 528/171; 528/173; 528/205; 528/228; 528/321; 428/435; 428/473.5; 428/901
[58] Field of Search .............. 528/322, 321, 170, 171, 528/173, 205, 228; 428/435, 473.5, 901

[56] References Cited

U.S. PATENT DOCUMENTS

| | | | |
|---|---|---|---|
| 4,876,325 | 10/1989 | Olson et al. | 528/170 |
| 5,004,775 | 4/1991 | Olson et al. | 524/371 |
| 5,053,474 | 10/1991 | Camberlin et al. | 528/322 |
| 5,102,981 | 4/1992 | Kan et al. | 528/322 |

*Primary Examiner*—John Kight, III
*Assistant Examiner*—P. Hampton-Hightower
*Attorney, Agent, or Firm*—Harold N. Wells; Mary Jo Boldingh; Jay P. Friedenson

[57] ABSTRACT

A thermosetting resin is comprised of (a) a bisimide, particularly a bismaleimide, (b) a reactive brominated aromatic compound, particularly a member of the group consisting of group consisting of tribromophenyl maleimide, tribromostyrene, and pentabromobenzyl acrylate; and (c) a multifunctional nitrogen compound, particularly dicyandiamide, and optionally
(d) ethylene bistetrabromophthalimide.

9 Claims, No Drawings

POLYIMIDE RESIN LAMINATES

FIELD OF THE INVENTION

The invention relates generally to cross-linked, heat resistant, thermosetting polyimide resins, used in the manufacture of laminates for the electronics industry.

PRIOR ART

Thermosetting resins prepared from bisimides and aromatic diamines are in commercial use. In some instances, such compositions are prepared as prepolymers and combined with epoxy compounds and crosslinked with dicyandiamide or other agents.

While resins derived from bisimides and aromatic diamines perform well in electronic laminates, they have several disadvantages. If substitute materials could be found that had improved performance, contained no free aromatic diamines, were less brittle and met UL flammability rating V-0, they should find ready acceptance in the marketplace.

In commonly assigned application Ser. No. 06/850,660 filed Apr. 11, 1986, now abandoned, thermosetting resins are produced by reacting bismaleimides (including a prepolymer chain-extended with an aromatic diamine) with styrene-terminated bisphenol (and/or the tetrabromo substituted compound). It is characteristic of these compositions to be blended together, combined with reinforcing materials, and cured to prepare laminates. Such compositions are not chemically reacted until the laminates are formed. Such resins are shown to have a desirably low dielectric constant, but they exhibit low peel strength and are too brittle and improved resins have been sought.

In U.S. Pats. Nos. 4,876,325 and 5,004,775 improved thermosetting resins were disclosed which had many desirable properties and represented an improvement over the resins described in U.S. Ser. No. 06/850,660 filed Apr. 11, 1986, now abandoned. It has now been found that laminates having properties similar to those disclosed in these patents may be prepared from a group of related brominated aromatic compounds, as will be discussed in detail below.

SUMMARY OF THE INVENTION

An improved thermosetting resin suitable for use in laminates for the electronics industry is prepared from (a) a bisimide, preferably a bismaleimide, (b) a reactive brominated aromatic compound, preferably a brominated aromatic maleimide, styrene, or aromatic acrylate, and (c) a multifunctional nitrogen compound, preferably dicyandiamide. Optionally, additional flame retardant properties may be achieved by including ethylene bistetrabromophthalimide in effective amounts while retaining the desirable properties of the resin.

In one aspect the invention is a flame retardant laminate which comprises a reinforcing fabric and the cured thermosetting resin described above.

In another aspect the invention is a printed circuit board which comprises such flame retardant laminates.

DESCRIPTION OF THE PREFERRED EMBODIMENTS

Composition of the Resin

A thermosetting resin composition according to the invention may comprise (a) a bisimide having the formula:

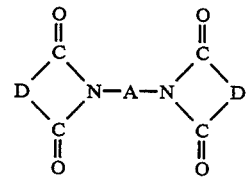

where A comprises at least one of alkylene radicals having 1 to 20 carbon atoms, cycloalkylene radicals having 4 to 40 carbon atoms, heterocyclic radicals containing at least one of O, S, and N, and phenylene or polycyclic aromatic radicals D is a divalent radical containing a carbon-carbon double bond (b) a reactive brominated aromatic compound, and (c) a multifunctional nitrogen compound.

The resin is principally comprised of a bisimide with minor amounts of components (b) and (c). The weights of (a), (b), and (c) preferably will be between 70 to 95%/1 to 30%/0.1 to 10%, respectively, most preferably 88 to 92%/6 to 10%/1 to 3%, respectively, based on the total of (a), (b), and (c). The ethylene bistetrabromophthalimide will be added in effective amounts up to about 10 weight percent based on the resin.

Bisimides

Bisimides are compounds having the general formula described above.

In a preferred embodiment the bisimide is a bismaleimide and the thermosetting resin composition may comprise (a) a bismaleimide having the formula:

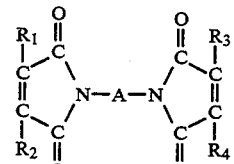

where A = —$C_6H_4$—$CH_2$—$C_6H_4$—, —$C_6H_4$—$\overset{\underset{|}{CH_3}}{\underset{|}{CH_3}}{C}$—$C_6H_4$—, —$C_6H_4$—$\overset{\underset{|}{CF_3}}{\underset{|}{CH_3}}{C}$—$C_6H_4$—, —$C_6H_4O$—$C_6H_4$—O—$C_6H_4$—,

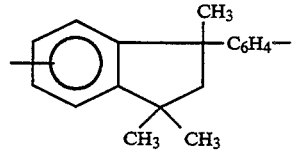

—$C_6H_4$—$C_6H_4$—, —$C_6H_4$—, —$C_6H_3CH_3$—,

—$C_6H_4$—O—$C_6H_4$—$\overset{\underset{|}{CF_3}}{\underset{|}{CF_3}}{C}$—$C_6H_4$—O—$C_6H_4$—,

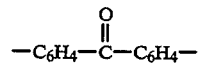

—$C_6H_4$—$CH_2$—O—$CH_2$—O—$CH_2$—$C_6H_4$—,

-continued

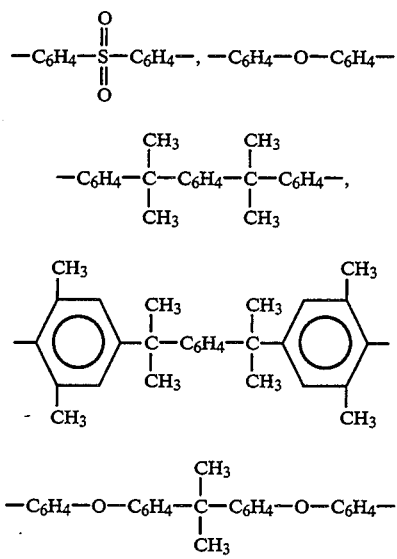

and $R_1$, $R_2$, $R_3$, $R_4$ are H, $CH_3$, $C_2H_5$, $C_3H_7$, $C_4H_9$, $C_5H_{11}$ (B) the reactive brominated aromatic compound is selected from the group consisting of tribromophenyl maleimide, tribromostyrene, and pentabromobenzyl acrylate; and (C) the multifunctional nitrogen compound is dicyandiamide.

Particularly preferred embodiments include those which have bismaleimides where A is

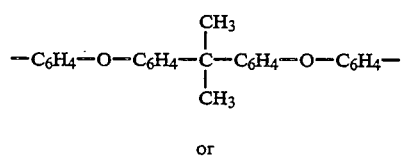

or

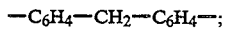

and $R_1$, $R_2$, $R_3$, $R_4$ are each H.

For purposes of the present invention, the bisimide compound will be selected to provide resins having improved toughness, low water absorption, low dielectric constant, and excellent thermal resistance.

Resins of the invention are usually comprised mainly of the bisimide, preferably from about 70 to 95 weight %, most preferably 88 to 92 weight percent. Typically, the prepolymers of bisimides and aromatic diamines of the prior art contain smaller amounts of the bisimides than are employed in the present resins. The bisimide can react with the brominated aromatic compound through the unsaturated carbon-carbon bond of the imide ring, but it may also react with itself in the same manner.

Brominated Aromatic Compounds

The brominated aromatic compounds are reactive with the bisimides and the multifunctional nitrogen compound. Three types have been identified and are classed as (a) aromatic imides, (b) styrenes, and (c) aromatic acrylates.

Imides

Generally the brominated aromatic imides have the formula

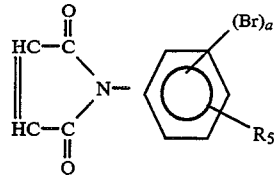

where $R_5$ is independently selected from the group consisting of H and lower alkyl a is an integer from 1 to 5

In one preferred embodiment $R_5$ is hydrogen and a is 3, corresponding to tribromophenyl maleimide.

Styrenes

The brominated styrenes may be represented by the formula

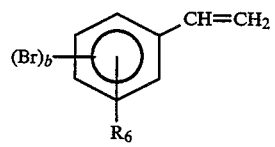

where $R_6$ is independently selected from the group consisting of

H and lower alkyl b is an integer from 1 to 5

In one preferred embodiment $R_6$ is hydrogen and b is 3, corresponding to tribromostyrene.

Acrylates

The brominated aromatic acrylates may be represented by the formula

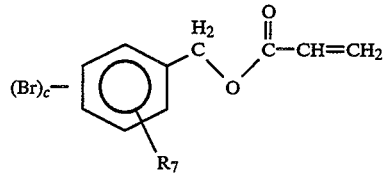

where $R_7$ is independently selected from the group consisting of H and lower alkyl c is an integer from 1 to 5

In one preferred embodiment $R_7$ is hydrogen and c is 3, corresponding to tribromobenzyl acrylate.

The brominated aromatic compounds are present in the resin in minor amounts, preferably about 1 to 30 wt. %, most preferably 6 to 10 wt. %.

Multifunctional Nitrogen Compounds

In the resins of the invention, a further component of the composition is a multifunctional nitrogen compound of the types used as curing agents in the laminating industry such as amines, and cyangen compounds such as dicyandiamide.

Broadly, the multifunctional nitrogen compounds may be defined by the formula

where:

Q is a member of the group consisting of C, alkyl, aryl, aralkyl, and ethers d is an integer from 2 to 4 e is either 0 or 1

$R_8$, $R_9$, are independently selected from the group consisting of H, $C_6H_4X$, $CH_2C_6H_4X$, $CH_2CH_2C_6H_4X$, $C_nH_{2n+1}$, or X and X is either —H, —$CH_3$, —$OCH_3$, —OH, —$NY_2$ or —CN N is an integer from 1 to 12

Y is —H or —$CH_3$

The Q group may include members of the group A defined above in connection with the bisimides. The functionality of such compounds may be defined as the number of hydrogen atoms free to react with the bisimide and the brominated aromatic compound. The preferred dicyandiamide has four reactive hydrogen atoms.

Dicyandiamide is more commonly used in prior art resin systems as a crosslinking agent after a prepolymer of a bisimide and a diamine has been formed.

Dicyandiamide has the formula

It is capable of reacting with the carbon-carbon double bond of the bismaleimide to extend the polymer chain.

Only relatively small amounts of the multifunctional nitrogen compound are required, broadly about 0.1 to 10 wt. % of the resin may be used. Preferably, about 1 to 3 wt. % would be reacted to form the resin.

Flame Retardants

Use of reactive aromatic compounds containing bromine improves flame retardant properties of laminates prepared from the above described resins. For some compositions and for some end uses it may be necessary to add additional flame retardants in order to meet required tests. The inventors have discovered that, contrary to experience with epoxy-based laminates, that bismaleimide-based laminates respond differently to the addition of bromine containing compounds. In particular, certain compounds are not sufficiently effective and/or may adversely affect other properties of the laminates. Generally, the amount of bromine present in the finished laminate does not predict the results of the usual flammability tests. It has been found that ethylene bistetrabromophthalimide is capable of providing laminates which meet the UL-94 test for flammability while retaining the other physical properties characteristic of the resins described above. Sufficient amounts of the ethylene bistetrabromophthalimide are added to the resin formulation to meet the UL-94 test for flammability, up to a maximum of about 10 weight percent, after which the other physical properties are adversely affected.

Resin Synthesis

The improved bismaleimide resins may be prepared by reacting the three components in a solvent at an elevated temperature to form a prepolymer. Optionally, ethylene bistetrabromophthalimide may be added to improve flame resistance. One convenient procedure is to warm a suitable solvent, such as dimethyl formamide (DMF), N-methylpyrrolidone, dimethyl acetamide, acetone, benzene, toluene, and the like to a temperature at which the chosen bismaleimide will be dissolved, say about 90° to 100° C. The bismaleimide is added to the solvent and mixed until dissolved. Then the temperature is increased to the desired reaction temperature, about 120° to 140° C., at which time the second and third components are added and mixed. The three-component mixture in the solvent will be maintained at the reaction temperature for a sufficient period of time to partially complete the reaction. Polymerization is completed during the manufacture of laminates.

Use of the Resins

The resins of the invention may be used to prepare laminates for the electronics industry by techniques generally in use in the field. Generally, the resins are diluted with a solvent and then used to impregnate a fabric with fibers of glass, high strength organic polymers, and the like familiar to those skilled in the art, and then dried at an elevated temperature. The resulting composite may then be laminated with other layers, such as copper foil, and then baked to fully cure the finished laminate. Such laminates may be used in fabrication of printed circuit boards having improved properties.

EXAMPLE 1

BMI monomer provided by the Monsanto Company (Skybond 3030) was dissolved in a mixture of dimethyl formamide (DMF) (84 wt. %) and N-methyl-2-pyrrolidone (NMP) (16 wt. %) at 90° C. Then tribromophenyl maleimide (FR1033 Dead Sea Bromine Group) and dicyandiamide were dissolved in the DMF-NMP solvent and added to the BMI solution. The mixture was then heated to 120° C. for 1 hour and then at 135° C. until the desired degree of reaction had been reached, as determined by sampling the mixture and determining the gel time by the stroke cure method on a cure plate. After about 6.5 hours the gel time had reached 7 minutes 33 seconds and the mixture was cooled to stop the reaction. The following summarizes the composition and the conditions of the reaction.

| Formula | |
|---|---|
| Monsanto 3030 | 700 g |
| FR1033 | 56 g |
| dicyandiamide | 14 g |
| DMF | 358 g |
| NMP | 70 g |
| Reaction | |
| 6.5 hours @ 135° C. | |
| Product | |
| Gel time - 244 sec at 171° C. | |

EXAMPLE 2

The resin produced in Example 1 was applied to 2116 CS309 glass cloth (Clark Schwebel) and then B-staged in an oven for 3 minutes at 177° C. to yield an impregnated material having a resin content of 46.3 wt. %. Six plies of the B-stage prepreg with copper foil on the surface were pressed together (300 psi/2068 kPa) using bonding sheets for 2.5 hours at 177° C. The laminate was post baked at 221° C. for 16 hours.

The finished laminate was examined and found to have the following properties.

| Property | Value |
|---|---|
| • Solder Blister @ 550° F. (288° C.) | • Passed 5400 seconds with no blisters |
| • Flammability | • 2.6 seconds (ave.) with longest burn 6 seconds |
| • Delamination | • Multilayer boards did not delaminate after 8 hours at 430° F. (221° C.) |

EXAMPLE 3

The general procedure was repeated using a different brominated aromatic compound (tribromostyrene, FR803, Dead Sea Bromine Group). The composition and the reaction conditions are summarized in the following table.

| Formula | |
|---|---|
| Monsanto 3030 | 700 g |
| FR803 | 14 g |
| Dicyandiamide | 14 g |
| DMF | 358 g |
| Toluene | 20 g |
| Reaction | |
| 4.5 hours @ 140° C. | |
| Product | |
| Gel time 444 sec at 171° C. | |

EXAMPLE 4

The resin of Example 3 was used to prepare a 6 ply laminate as described in Example 2. In this instance the resin was diluted with NMP to produce a 90 wt. % mixture and 2 wt. % ethylene bistetrabromophthalimide (BT93 Ethyl Corp.) was added to improve flame resistance. The coated glass cloth was B-staged for 5.5 minutes at 76° C. to produce a prepreg containing 44.5 wt. % resin. The six-ply laminate was again pressed at 300 psi (2068 kPa) for 2.5 hours and then postbaked for 16 hours at 221 ° C.

The finished laminate was found to have the following properties.

| Property | Value |
|---|---|
| • Solder blister @ 550° F. (288° C.) | • passed 5400 seconds with no blisters |
| • Flammability | • 2.6 seconds (ave.) with longest burn 6 seconds |
| • Delamination | • Multilayer boards did not delaminate after 8 hours at 430° F. (221° C.) |

What is claimed:

1. A thermosetting resin composition consisting essentially of:
   (a) a bisimide having the formula:

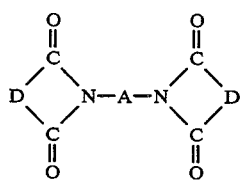

where
   A comprises at least one of alkylene radicals having 1 to 20 carbon atoms, cycloalkylene radicals having 4 to 40 carbon atoms, heterocyclic radicals containing at least one of O, S, and N, and phenylene or polycyclic aromatic radicals
   D is a divalent radical containing a carbon-carbon double bond;
   b) a reactive brominated aromatic compound selected from the group consisting of imides, styrenes, and acrylates; wherein said imides have the formula

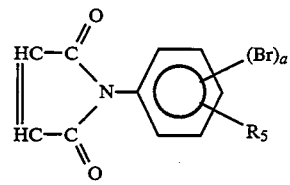

where $R_5$, is independently selected from the group consisting of
   H and lower alkyl
   a is an integer from 1 to 5; and
   wherein said styrenes have the formula

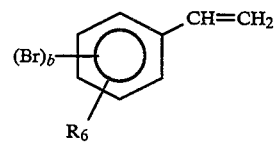

where $R_6$ is independently selected from the group consisting of
   H and lower alkyl
   b is an integer from 1 to 5; and
   wherein said acrylates have the formula

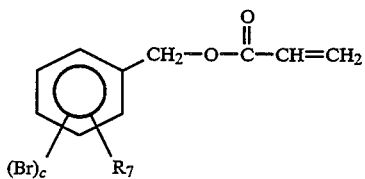

where $R_7$ is independently selected from the group consisting of
   H and lower alkyl;
   c is an integer from 1 to 5;
   (c) dicyandiamide; and (d) with or without ethylene bistetrabromophthalimide.

2. A thermosetting resin composition of claim 1 wherein the weights of (a), (b), and (c) are 88 to 92%/6 to 10%/and 1 to 3% respectively.

3. A thermosetting resin composition of claim 1 wherein (a) is:

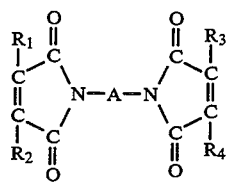

-continued where A is —C$_6$H$_4$—CH$_2$—C$_6$H$_4$—, —C$_6$H$_4$—C(CH$_3$)$_2$—C$_6$H$_4$—,

—C$_6$H$_4$—C(CF$_3$)$_2$—C$_6$H$_4$—, —C$_6$H$_4$O—C$_6$H$_4$—O—C$_6$H$_4$—,

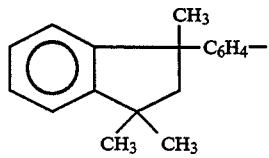

—C$_6$H$_4$—C$_6$H$_4$—, —C$_6$H$_4$—, —C$_6$H$_3$CH$_3$—,

—C$_6$H$_4$—O—C$_6$H$_4$—C(CF$_3$)$_2$—C$_6$H$_4$—O—C$_6$H$_4$—,

—C$_6$H$_4$—C(=O)—C$_6$H$_4$—

—C$_6$H$_4$—CH$_2$—O—CH$_2$—O—CH$_2$—C$_6$H$_4$—,

—C$_6$H$_4$—S(=O)$_2$—C$_6$H$_4$—, —C$_6$H$_4$—O—C$_6$H$_4$—

—C$_6$H$_4$—C(CH$_3$)$_2$—C$_6$H$_4$—C(CH$_3$)$_2$—C$_6$H$_4$—,

-continued

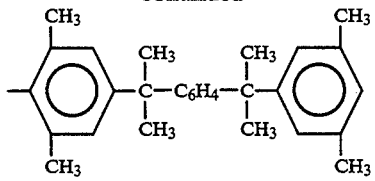

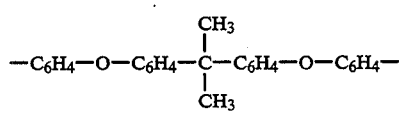

$R_1, R_2, R_3, R_4$ are $\neq$ H, CH$_3$, C$_2$H$_5$, C$_3$H$_7$, C$_4$H$_9$, C$_5$H$_{11}$.

4. A thermosetting resin composition of claim 1 wherein (b) is tribromophenyl maleimide.

5. A thermosetting resin composition of claim 1 wherein (b) is tribromostyrene.

6. A thermosetting resin composition of claim 1 wherein (b) is pentabromobenzyl acrylate.

7. A flame resistant laminate comprising a reinforcing fabric and a cured thermosetting resin composition consisting essentially of:
(a) a bismaleimide;
(b) a reactive brominated aromatic compound selected from the group consisting of tribromophenyl maleimide, tribromostyrene, and pentabromobenzyl acrylate; and
(c) dicyandiamide, with or without
(d) ethylene bistetrabromophthalimide.

8. The flame retardant laminate of claim 7 wherein the weight of (a), (b), and (c) are 70 to 95%/1 to 30%/and 0.1 to 10% respectively and (d) is present in an effective amount up to about 10 weight percent.

9. A printed circuit board comprising the flame resistant laminate of claims 7 or 8.

* * * * *